United States Patent
Zhou et al.

(10) Patent No.: US 12,385,700 B2
(45) Date of Patent: Aug. 12, 2025

(54) 3D PRINTED COLD PLATES AND METHODS FOR COOLING POWER DEVICES EMBEDDED IN 3D PRINTED CIRCUIT BOARDS

(71) Applicant: Toyota Motor Engineering & Manufacturing North America, Inc., Plano, TX (US)

(72) Inventors: Feng Zhou, Ann Arbor, MI (US); Ercan Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 0 days.

(21) Appl. No.: 18/431,191

(22) Filed: Feb. 2, 2024

(65) Prior Publication Data

US 2024/0230248 A1    Jul. 11, 2024

Related U.S. Application Data

(62) Division of application No. 17/529,423, filed on Nov. 18, 2021, now Pat. No. 11,920,877.

(51) Int. Cl.
*F28F 3/12*    (2006.01)
*B33Y 80/00*   (2015.01)
*F28F 3/02*    (2006.01)
*H05K 7/20*    (2006.01)

(52) U.S. Cl.
CPC ............... *F28F 3/12* (2013.01); *B33Y 80/00* (2014.12); *F28F 3/02* (2013.01); *H05K 7/20254* (2013.01); *F28F 2270/00* (2013.01)

(58) Field of Classification Search
CPC ........ F28F 3/12; F28F 3/00; F28F 3/02; F28F 2270/00; F28F 2265/24; F28F 2265/00; F28F 3/022; B33Y 80/00; B33Y 50/02; B33Y 10/00; H05K 7/20254; H05K 7/2018; H05K 7/20; H05K 7/00; H05K 7/2089; H01L 23/3677; H01L 23/473; H01L 23/367; H01L 23/36; H01L 23/34; H01L 23/00
See application file for complete search history.

(56) References Cited

U.S. PATENT DOCUMENTS

| | | | |
|---|---|---|---|
| 7,835,151 B2* | 11/2010 | Olesen | H01L 23/473 361/689 |
| 9,559,508 B2* | 1/2017 | Shepard | H05K 7/20845 |
| 11,015,872 B2* | 5/2021 | Aston | H05K 7/20254 |
| 11,778,775 B2* | 10/2023 | Adam | H05K 7/20254 361/699 |
| 11,885,579 B2* | 1/2024 | Aston | H01L 23/473 |

(Continued)

FOREIGN PATENT DOCUMENTS

| | | | |
|---|---|---|---|
| CN | 108759533 A | 11/2018 | |
| CN | 110165355 A * | 8/2019 | ............... H01Q 1/02 |

(Continued)

*Primary Examiner* — Lawrence Averick
(74) *Attorney, Agent, or Firm* — Dinsmore & Shohl LLP

(57) ABSTRACT

A method includes printing, using a 3D printer, a cold plate, printing, using a 3D printer, an electrical insulation layer embedded in a top surface of the cold plate, and printing, using a 3D printer, a conductor substrate embedded in the electrical insulation layer embedded in the top surface of the cold plate.

17 Claims, 9 Drawing Sheets

(56) References Cited

U.S. PATENT DOCUMENTS

| | | | |
|---|---|---|---|
| 11,920,877 B2* | 3/2024 | Zhou | B33Y 10/00 |
| 12,082,368 B2* | 9/2024 | Adam | H05K 7/20872 |
| 12,181,227 B2* | 12/2024 | Bardeleben | F28F 1/40 |
| 2005/0247432 A1* | 11/2005 | Bhatti | F28F 3/04 |
| | | | 165/80.3 |
| 2009/0146293 A1* | 6/2009 | Olesen | H05K 7/20927 |
| | | | 257/714 |
| 2012/0014066 A1* | 1/2012 | Morino | H05K 7/20509 |
| | | | 165/185 |
| 2013/0299148 A1* | 11/2013 | Hernon | B22D 25/02 |
| | | | 165/185 |
| 2015/0201499 A1* | 7/2015 | Shinar | H05K 1/0284 |
| | | | 425/132 |
| 2016/0114439 A1* | 4/2016 | Pal | F28F 3/02 |
| | | | 165/185 |
| 2016/0150678 A1* | 5/2016 | Kim | H01L 23/473 |
| | | | 361/699 |
| 2017/0084810 A1* | 3/2017 | Klein | H05K 1/0373 |
| 2017/0092565 A1* | 3/2017 | Chen | H05K 7/20281 |
| 2019/0141861 A1* | 5/2019 | Shedd | H05K 7/20836 |
| 2019/0302178 A1* | 10/2019 | Saito | F16K 11/07 |
| 2019/0360759 A1* | 11/2019 | Collins | H01L 23/473 |
| 2019/0373773 A1* | 12/2019 | Bougher | B29C 64/106 |
| 2020/0383238 A1* | 12/2020 | Chan | H05K 7/20281 |
| 2021/0190431 A1* | 6/2021 | Kitazaki | H01Q 21/061 |
| 2021/0392780 A1* | 12/2021 | Adam | H05K 7/20254 |
| 2022/0053663 A1* | 2/2022 | Adam | H05K 7/2039 |
| 2022/0217868 A1* | 7/2022 | Adam | H05K 1/0203 |
| 2023/0152047 A1* | 5/2023 | Zhou | H05K 7/20254 |
| | | | 165/104.19 |
| 2023/0230852 A1* | 7/2023 | Plotnikov | B22F 3/11 |
| | | | 165/186 |
| 2024/0183620 A1* | 6/2024 | Chen | H01L 23/3733 |
| 2024/0230248 A1* | 7/2024 | Zhou | B33Y 80/00 |

FOREIGN PATENT DOCUMENTS

| | | | |
|---|---|---|---|
| CN | 110165355 B | * 11/2020 | H01Q 1/02 |
| CN | 111902029 A | * 11/2020 | H05K 7/2029 |
| CN | 111902029 B | * 11/2022 | H05K 7/2029 |
| WO | 2020256638 A1 | 12/2020 | |

* cited by examiner

3D PRINTED COLD PLATES AND METHODS FOR COOLING POWER DEVICES EMBEDDED IN 3D PRINTED CIRCUIT BOARDS

CROSS-REFERENCE TO RELATED APPLICATIONS

This application is a divisional of U.S. patent application Ser. No. 17/529,423, filed Nov. 18, 2021, the entire contents of each of which are incorporated herein by reference.

TECHNICAL FIELD

The present specification generally relates to cooling devices for embedded power devices, and more specifically, to systems and methods of forming cold plates.

BACKGROUND

Electric vehicles, robotic systems, and other electronically driven devices utilize power electronics packages to convert and deliver power to system components from an energy source and vice versa. For future electrified vehicles, especially autonomous driving vehicles for mobile service, compact power electronic packages that are capable of delivering high power are needed. Currently, compact integrated power devices embedded within driver boards formed using lamination and machining processes have delivered high power density power designs. However, limitations arising from the lamination and machining processes of forming cold plates and embedding power devices therein are ripe for improvement and innovation.

SUMMARY

In an embodiment, a device is disclosed. The device may comprise a 3D printed cold plate having a hollow interior recess. A plurality of fins may be positioned in the hollow interior recess, and an inlet port and outlet port may be fluidly coupled to the hollow interior recess of the cold plate. The device may further be a single monolithic structure. In another embodiment, a method includes involve printing, using a 3D printer, a cold plate, and printing, using a 3D printer, an electrical insulation layer embedded in the cold plate. The method may further involve printing, using a 3D printer, a conductor substrate embedded in the electrical insulation layer embedded in the cold plate.

In another embodiment, a method includes involve printing, using a 3D printer, a cold plate, and printing, using a 3D printer, an electrical insulation layer embedded in the cold plate. The method may further involve printing, using a 3D printer, a conductor substrate embedded in the electrical insulation layer embedded in the cold plate.

In yet another embodiment, a method involves printing, using a 3D printer, a cold plate having a hollow interior recess and a plurality of fins positioned in the hollow interior recess. The method may further involve fabricating an electrical insulation layer, fabricating a conductor substrate, and bonding the conductor substrate to the electrical insulation layer. The method may also involve fabricating a power device and bonding the power device to the conductor substrate. Finally, the method may involve bonding the power device, conductor substrate, and electrical insulation layer to the cold plate, such that the power device, conductor substrate, and electrical insulation layer are embedded in the cold plate.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
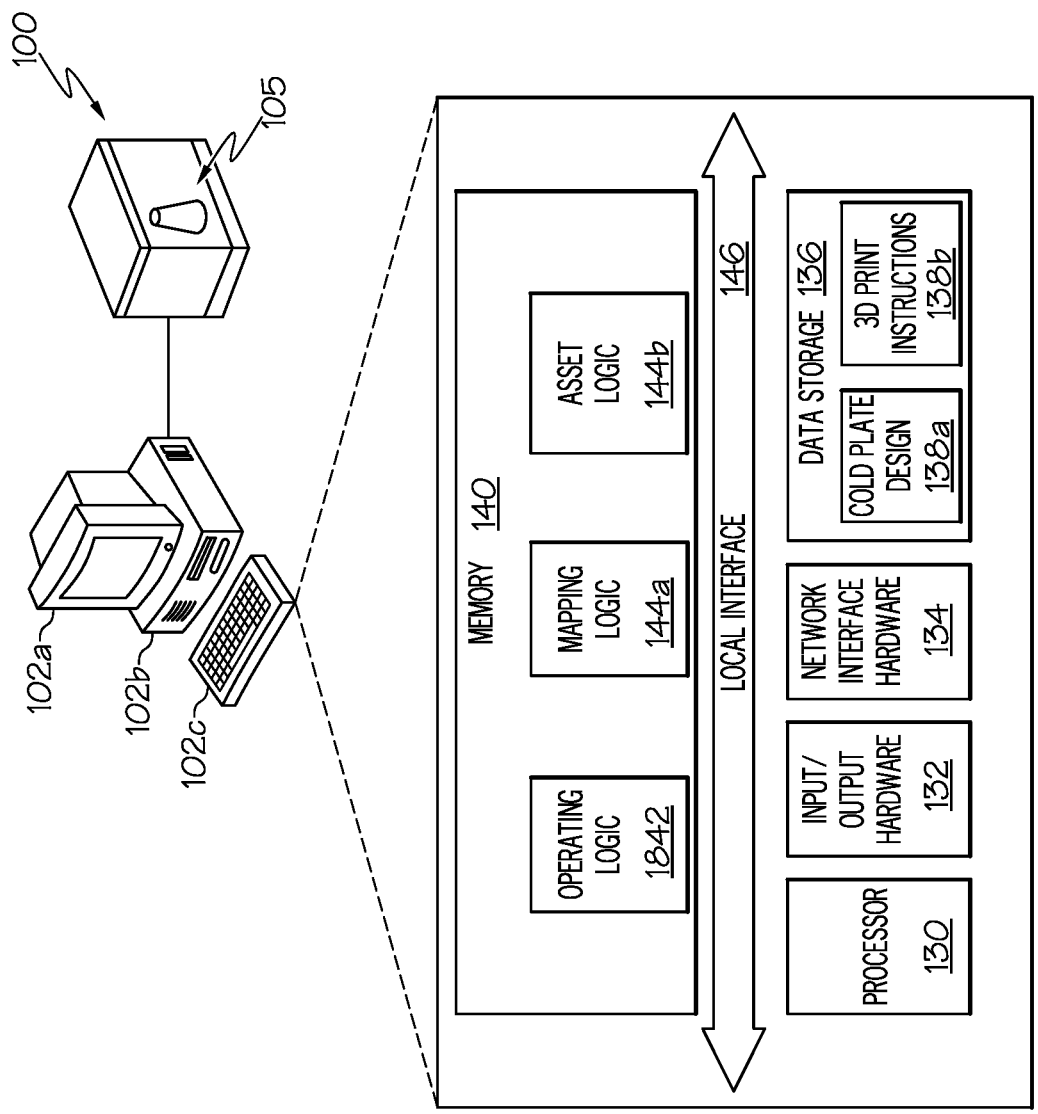
FIG. 1 depicts an illustrative system having an electronic controller for forming an integrated power electronics package by 3D-printing a cold plate according to one or more embodiments shown and described herein.

Embodiments disclosed herein relate to cold plates and systems and methods of forming cold plates via a three dimensional (3D) printing process. More specifically, the present disclosure includes a 3D printed cold plate having porous fins configured to cool power devices embedded in the cold plate. In some embodiments, the 3D printed cold plate may comprise a 3D printed conductor substrate and a 3D printed electrical insulation layer. In these embodiments, the 3D printed conductor substrate may include a plurality of cavities, which may be configured to receive the power devices such that the power devices are embedded in the cold plate.

As described in more detail herein, 3D printed dielectric layers and conductor layers of PCB may be formed on top of the 3D printed cold plate to connect the power devices and to lay out a driver, controller circuit, or other similar circuit in the PCB. Additional electronic components, such as resistors and capacitors, may be mounted to the 3D printed PCB.

As provided herein, the term "3D printed" may refer to the additive manufacturing process used to create a desired object, such as a cold plate, by stacking (e.g., printing) a plurality of layers of plastic, resin, metal, or the like, to create a solid three-dimensional part. The 3D-printing process may involve generating a digital model, such as a computer-aided design (CAD) model, which may be broken down into a plurality of horizontal layers to create a template for the 3D printer device to follow.

3D-printing may be specifically advantageous for the formation of cold plates. Notably, there is an increasing demand to make cold plates which are more compact and efficient than those achievable using conventional forming processes, which often require multiple forming steps such as forming, welding, and the like. To effectively provide cooling, it may be desirable to form cold plates having complex heat dissipation structures that may be too complex to be formed using conventional methods. In addition, even if such complex structures could be formed using conventional methods, it may often be more expensive and/or more time consuming to create via conventional methods relative to their 3D printed counterparts.

3D printed cold plates may also offer increased thermal performance by utilizing complex geometries that are not achievable using conventional fabrication techniques. For example, 3D printed cold plates have a much smaller attainable thickness than those plates formed using conventional techniques. By utilizing smaller features, it may be possible to create more intricate flow channels within the cold plate, such that the total surface area of the plate is increased. The increase in surface area may in turn increase the amount of heat which may be removed by the plate, thereby increasing the thermal performance of the plate.

Furthermore, 3D printed cold plates may be lighter and more compact than conventionally formed cold plates. For example, the ability to form unique shapes and internal features provided by 3D-printing allows for cold plates which utilize less material, such that the plates are lighter and more compact. Additionally, 3D printed cold plates may be formed as monolithic structures, such that the plate does not include any joined sections, openings, and/or the like which may result in loss of heat transfer or the escape of coolant (e.g., fluid). This is a stark improvement over conventionally formed cold plates, which are often formed by at least two shells having a number of seals and/or joints which may be prone to leakage.

Finally, 3D printed cold plates benefit from a simplified production process. Notably, the process of 3D-printing cold plates alleviates the need for forming, brazing, welding, and the like, all of which are expensive and time-consuming endeavors, and allows for streamlined production of cold plates.

Embodiments of the cold plates and systems and methods of forming integrated power electronics packages by 3D-printing cold plates will now be described in more detail herein. The following will now describe these systems, methods, and devices in more detail with reference to the drawings and where like numbers refer to like structures.

Referring to FIG. 1, an illustrative system 100 having an electronic controller 102 for forming an integrated power electronics package by 3D-printing a cold plate is depicted. In some embodiments, the system 100 includes an electronic controller 102 such as a computing device communicatively coupled to a 3D printer 105. The electronic controller 102 may include a display 102a, a processing unit 102b and/or an input device 102c, each of which may be communicatively coupled to one another. The electronic controller 102 may be a server, a personal computer, a laptop, a tablet, a smartphone, a handheld device, or a similar computing device. The electronic controller 102 may be used by a user of the system 100 to provide information to the system 100. The electronic controller 102 may utilize a local application, a web application, or the like to access the 3D printer 105 that is communicatively coupled to the electronic controller 102 as described herein. The system 100 may also include one or more data servers (not shown) having one or more databases, from which cold plate designs, 3D-print instructions or the like (e.g., CAD files or the like) may be queried, extracted, updated, and/or utilized by the electronic controller 102.

The electronic controller 102, which is described in more detail herein, may be configured to host applications and execute processes related to the system described herein. It should be understood that while an electronic controller 102 and a 3D printer 105 are depicted in the illustrative system 100 in FIG. 1, each of the functions and operations performed by the electronic controller 102 may be embodied and deployed in a distributed computing environment having a plurality of electronic controllers 102 and a plurality of 3D printers 105. It is also understood that while the electronic controller 102 is depicted as a personal computer, this is merely an example. In some embodiments, any type of computing device (e.g., mobile computing device, personal computer, server, and the like) may be utilized for any of these components. Moreover, in some embodiments, the electronic controller 102 may be a component of the 3D printer 105.

The electronic controller 102 includes internal components such as, for example, a processor 130, input/output hardware 132, network interface hardware 134, a data storage component 136, which may store a database of cold plate designs 138a and/or a database of 3D printer instructions corresponding to one or more of the cold plate designs 138a, and/or a memory component 140. The memory component 140 may be machine readable memory (which may also be referred to as a non-transitory processor readable memory). The memory component 140 may be configured as volatile and/or nonvolatile memory and, as such, may include random access memory (including SRAM, DRAM, and/or other types of random access memory), flash memory, registers, compact discs (CD), digital versatile discs (DVD), and/or other types of storage components. Additionally, the memory component 140 may be configured to store operating logic 1842, system logic 144a for implementing one or more of the methods described herein, and interface logic 144b for implementing an interactive interface between a user and the system 100 (each of which may be embodied as a computer program, firmware, or hardware, as an example). A local interface 146 is also included in FIG. 1 and may be implemented as a bus or other interface to facilitate communication among the components of the electronic controller 102.

The processor 130 may include any processing component(s) configured to receive and execute programming instructions (such as from the data storage component 136 and/or the memory component 140). The instructions may be in the form of a machine-readable instruction set stored in the data storage component 136 and/or the memory component 140. The input/output hardware 132 may include the monitor 102a, the keyboard 102c, mouse, printer, camera, microphone, speaker, and/or other device for receiving, sending, and/or presenting data. The network interface hardware 134 may include any wired or wireless networking hardware, such as a modem, LAN port, Wi-Fi card, WiMax card, mobile communications hardware, and/or other hardware for communicating with other networks and/or devices.

It should be understood that the data storage component 136 may reside local to and/or remote from the electronic controller 102 and may be configured to store one or more pieces of data for access by the electronic controller 102 and/or other components. As illustrated in FIG. 1, the data storage component 136 may store a database of cold plate designs 138a and/or a database of 3D printer instructions corresponding to one or more of the cold plate designs 138a.

The data storage component 136 also includes a database of 3D printer instructions corresponding to one or more of the cold plate designs 138a. The 3D printer instructions may be generated by the electronic controller 102 or another computing system. The 3D printer instructions include the specific motion and deposition instructions for a predetermined 3D printer model such that the 3D printer can build the cold plate according to the cold plate design 138a defined by a user.

The system 100 further includes a 3D printer 105 communicatively coupled to the electronic controller 102. The 3D printer 105 may be any rapid-prototyping, rapid manufacturing device, or additive manufacturing device such as a material jet (MJ), a binder jet (BJ), a drop on demand (DOD), fused deposition modeling (FDM), stereolithography (SLA), digital light processing (DLP), selective laser sintering (SLS), selective laser melting (SLM), laminated object manufacturing (LOM), electron beam melting (EBM), and/or the like type 3D printer. Specific examples of each of the types of 3D printers noted above (e.g., commercially available 3D printers) should generally be understood. The 3D printer 105 may include a processor and/or a memory (not shown) and other electronic components for receiving 3D-printing instructions 138b for printing a cold plate design 138a and carrying out a printing process accordingly. The 3D-printing instructions 138b may be, for example, a design configuration file corresponding to the cold plate design 138a for printing which may be transmitted to the 3D printer 105.

In some embodiments, the system 100 may be implemented through the interconnectivity of multiple devices, for example, through a network where the electronic controller 102 and the 3D printer 105 may be collocated or at different locations. In other embodiments, the system 100 is implemented through an electronic controller 102 that is communicatively coupled to the 3D printer 105. Regardless of the implementation of the system 100, the electronic controller 102 may utilize hardware, software, and/or firmware, according to embodiments shown and described herein. While in some embodiments, the electronic controller 102 may be configured as a general-purpose computer with the requisite hardware, software, and/or firmware, in some embodiments, the electronic controller 102 may be configured as a special purpose computer designed specifically for performing the functionality described herein.

Figure 2:
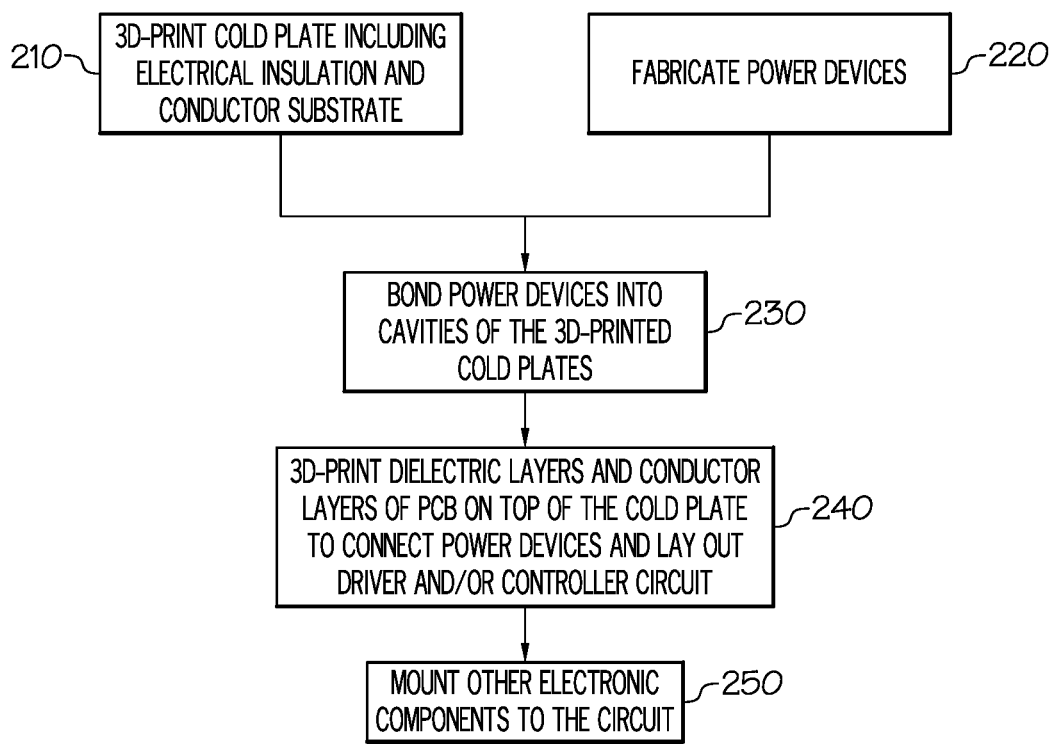
FIG. 2 depicts a flow diagram of an illustrative method for forming an integrated power electronics package by 3D-printing a cold plate, according to one or more embodiments shown and described herein.

Referring now to FIG. 2, an illustrative flow diagram of an illustrative method for forming an integrated power electronics package using a 3D printer to build the cold plate is depicted. The method of forming the integrated power electronics package described herein provides an improvement in the thermal management of the integrated power electronics package. Initially, 3D-printing the cold plate, along with other components, results in a single, monolithic structure which does not include the limitations of cold plates formed using conventional methods. Notably, cold plates formed using traditional methods often include numerous seals and/or joints which are prone to leakage over time, thus inhibiting the thermal management of the cold plates. By 3D-printing the cold plate as a single structure, these leakage concerns are alleviated. Furthermore, the method of 3D-printing the cold plate allows for the utilization of geometries which may not be achievable using conventional fabrication techniques. These unique geometries may allow for an increase in the overall surface area of the cold plate, which may in turn increase the amount of heat the cold plate is able to transfer away from any embedded electronic components.

Additionally, the method of 3D-printing the PCB on and/or around power devices embedded within the cold plate may provide additional thermal benefits.

Specifically, 3D-printing the PCB eliminates grease layers and other thermal interface layers between the PCB and cold plate, and acts to alleviate the need for external insulation layers. Furthermore, the 3D printed PCB may be thinner and more efficient with respect to heat transfer than a conventionally laminated PCB.

Figure 3:
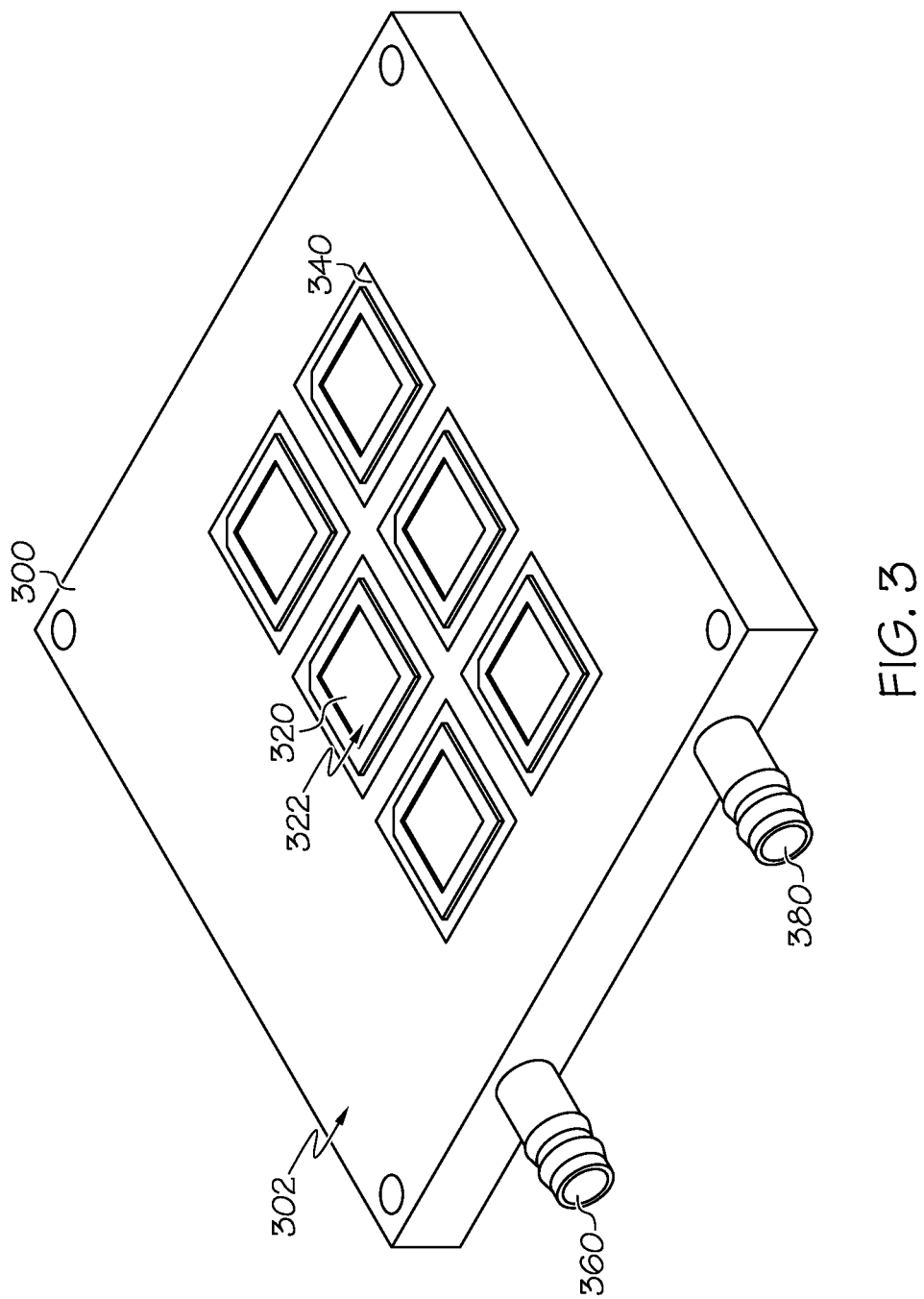
FIG. 3 depicts a perspective view of an illustrative 3D printed cold plate, according to one or more embodiments shown and described herein.

The method 200 for forming the integrated power electronics package using a 3D printer to build the cold plate 300 will now be described. Referring to block 210 of FIG. 2, the method may first involve printing a cold plate 300 using a 3D printer, as illustrated in FIG. 3. Because the cold plate is 3D printed, the design of the cold plate is not limited to designs that are manufacturable by traditional fabrication methods, such as machining, casting, extrusion, etc. These fabrication methods often rely on planar arrays or cross-drilled holes to create internal components within cold plates, which limits the complexity of the components that may be formed. In contrast, 3D printed cold plates may include fully optimized internal geometries, such as straight channels, pin fins, microstructure channels, or the like.

Referring to FIGS. 2-3, the method may further involve 3D-printing conductor substrates 320 and electrical insulation layers 340 into a top surface 302 of the cold plate 300 as the cold plate 300 is formed, such that the conductor substrates 320 and electrical insulation layers 340 are embedded into the cold plate 300. In some embodiments, either or both of the conductor substrate 320 and electrical insulation layer 340 may be 3D printed. In these embodiments, the 3D printed conductor substrate 320 may include the same material used to print the 3D printed cold plate 300, but different conductor materials are also contemplated. Furthermore, the 3D printed electrical insulation layer 340 may be formed of 3D printed ceramic, or any other suitable insulator. By 3D printing the conductor substrate 320 and electrical insulation layer 340, the number of bonding processes required to form the cold plate 300 may be minimized. Conventional methods of forming cold plates may require separately bonding the conductor substrate to the electrical insulation layer, and then separately bonding the two components onto the cold plate. By 3D-printing the conductor substrate 320 and electrical insulation layer 340 as structures embedded within the cold plate 300, these additional bonding processes may be eliminated.

Referring to FIG. 3, the cold plate 300 may further include an inlet port 360 and outlet port 380, each of which may be configured to allow fluid and/or vapor, such as coolant, to pass through the 3D printed cold plate 300. The coolant may enter the cold plate 300 via the inlet port 360 and exit the cold plate 300 via the outlet port 380.

Figure 4A:
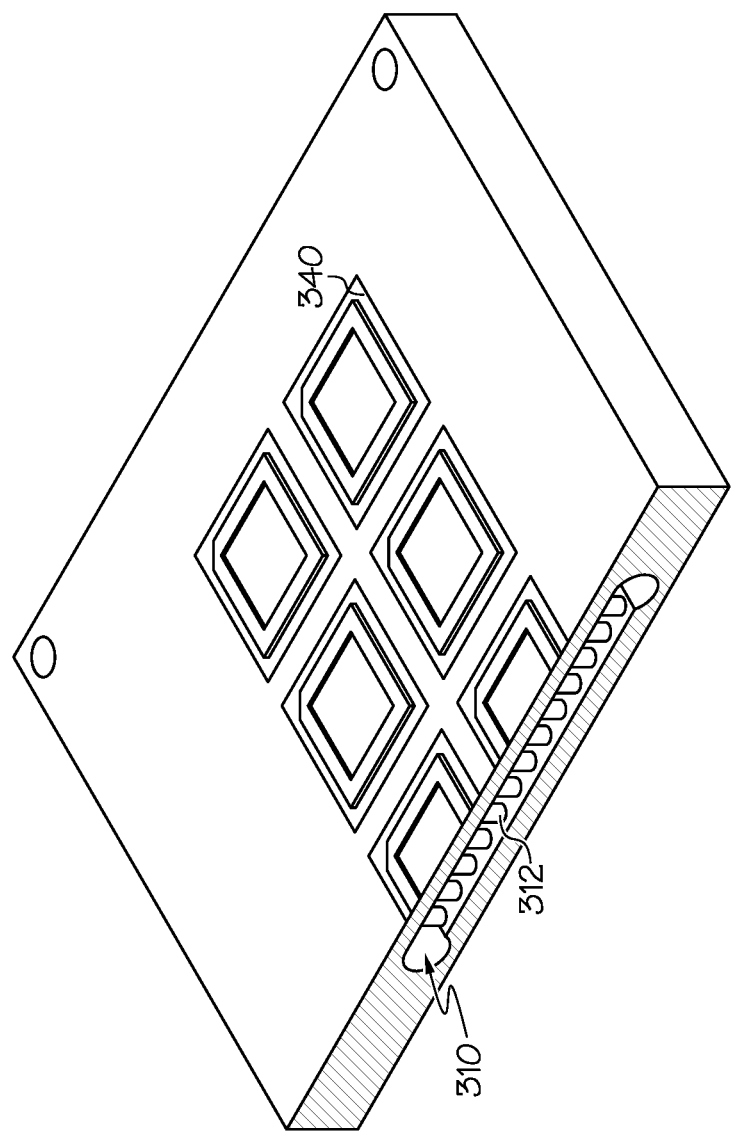
FIG. 4A depicts a cross-sectional view of the 3D printed cold plate of FIG. 3, according to one or more embodiments shown and described herein.

Turning now to FIG. 4A, a cross-sectional view of the cold plate 300 is shown. The cold plate 300 may be 3D printed such that the cold plate 300 includes a hollow interior recess 310, which may house cooling components including a plurality of fins 312, such as porous fins. In some embodiments, the fins 312 may be 3D printed along with the cold plate 300, such that the fins 312 and the cold plate 300 are a single monolithic structure. In other embodiments, the fins 312 may be formed separately using traditional fabrication methods, such as machining, casting, extrusion, and other similar processes, and then bonded to the 3D printed cold plate 300, and more particularly, into the hollow interior recess 310. In such embodiments, the fins 312 may be bonded to the interior recess 310 with thermally conductive epoxy, brazing, welding, or similar bonds.

In embodiments in which the fins 312 are 3D printed, the printing process may be configured to control the permeability and porosity of the fins 312 in particular regions of the hollow interior recess 310 of the cold plate 300. For example, the 3D printer 105 may receive 3D printing instructions 138b which may include information relating to the porosity and/or permeability of the porosity of fins 312. As 3D printer 105 forms the monolithic cold plate 300 having interior recess 310 and fins 312, the printer 105 may adjust the permeability and/or porosity of the fins 312 based on the printing instructions 138b. By controlling the permeability and/or porosity of the plurality of fins 312, the 3D printer may control the surface area of the cold plate 300 which is contacted by coolant, thereby controlling the heat exchange of the cold plate 300. In some embodiments, the cold plate 300 may include a plurality of regions, such that each region includes a plurality of fins 312 having different porosities and/or permeability. In this embodiment, the 3D printed cold plate 300 may be configured to have different heat exchange properties in each of the plurality of regions, which may be desirable for cooling different embedded electronic components in each of the plurality of regions. While the embodiment of FIG. 4A illustrates the cold plate 300 as comprising a plurality of fins 312, it should be known that the cold plate 300 may be further designed to include a plurality of straight channels, pin fins, manifold microchannel structures and/or the like.

Figure 4B:
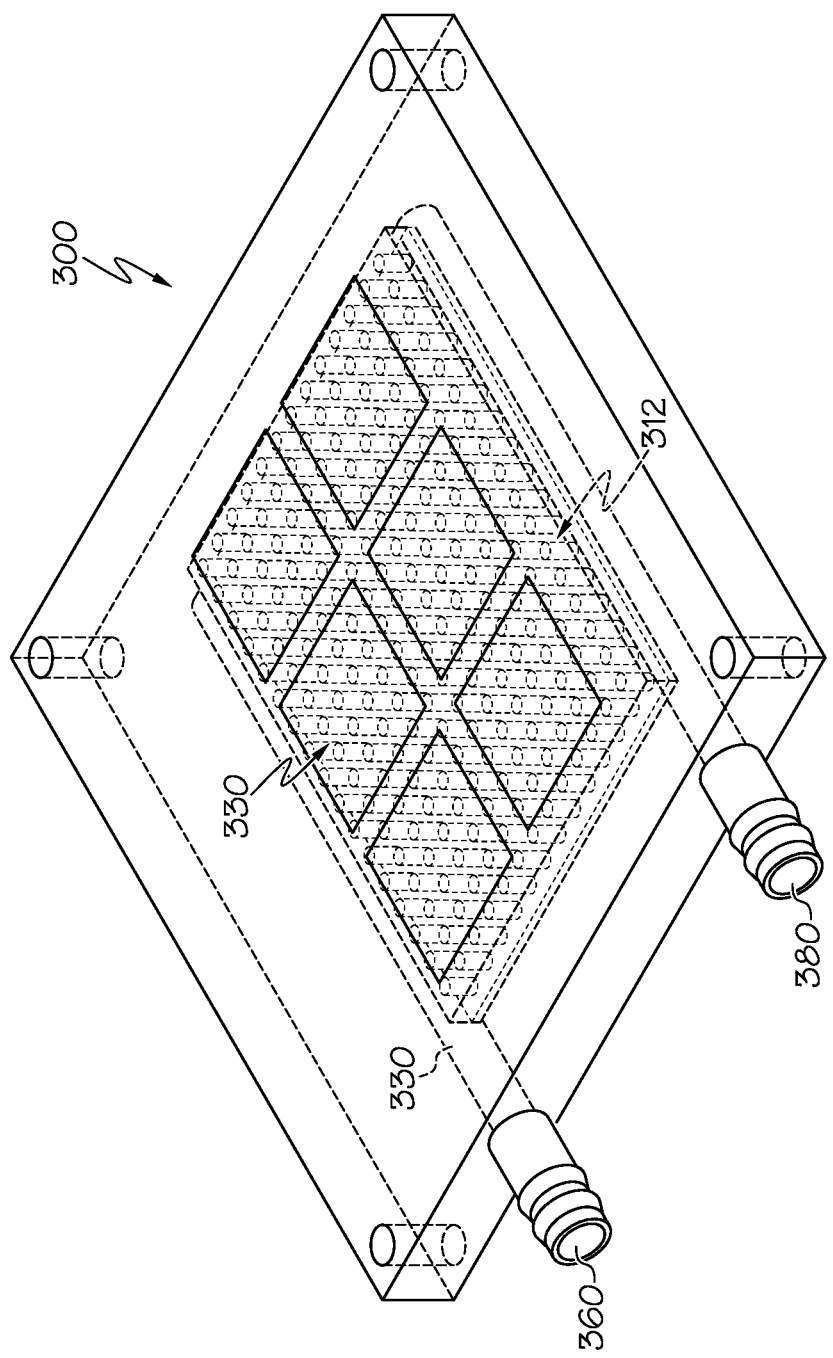
FIG. 4B depicts a transparent view of the 3D printed cold plate of FIG. 3, showing illustrative internal components thereof, according to one or more embodiments shown and described herein.

Referring now to FIGS. 4A and 4B, the fins 312 may be configured to enhance heat transfer in both single-phase cooling and two-phase cooling depending on the cooling application for which the cold plate 300 is needed. For example, in the instance where a high degree of cooling is required, such as the cooling of one or more power devices, the fins 312 may be configured as two-phase cooling structures. In this embodiment, the fins 312 may be positioned adjacent the one or more power devices 330 that are embedded in the cold plate 300. Accordingly, the heat generated by the one or more power devices 330 causes the fluid infused within the porous fins 312 to boil and transform into vapor that escapes the porous fins 312, thereby transporting heat from the one or more power devices 330. The vapor may condense on surfaces within the hollow interior recess 310 or escape the interior recess 310 through the outlet port 380, which fluidly couples the interior recess 310 to an external environment of the cold plate 300.

In other embodiments, the fins 312 may be configured to provide single-phase cooling of the cold plate 300. In these embodiments, the fins 312 may be porous or solid, depending on the application. The fins 312 may allow fluid to flow relatively unrestricted within the interior recess 310 of the cold plate 300 such that the fluid is able to extract heat from the power devices 330 embedded in the cold plate. In a single-phase configuration, the fluid that flows through and/or around the fins 312 may increase in temperature but will generally remain in liquid form. Once the fluid flows through and/or around the fins 312, the fluid may exit the interior recess 310 of the cold plate 300 through the outlet port 380.

Figure 5A:
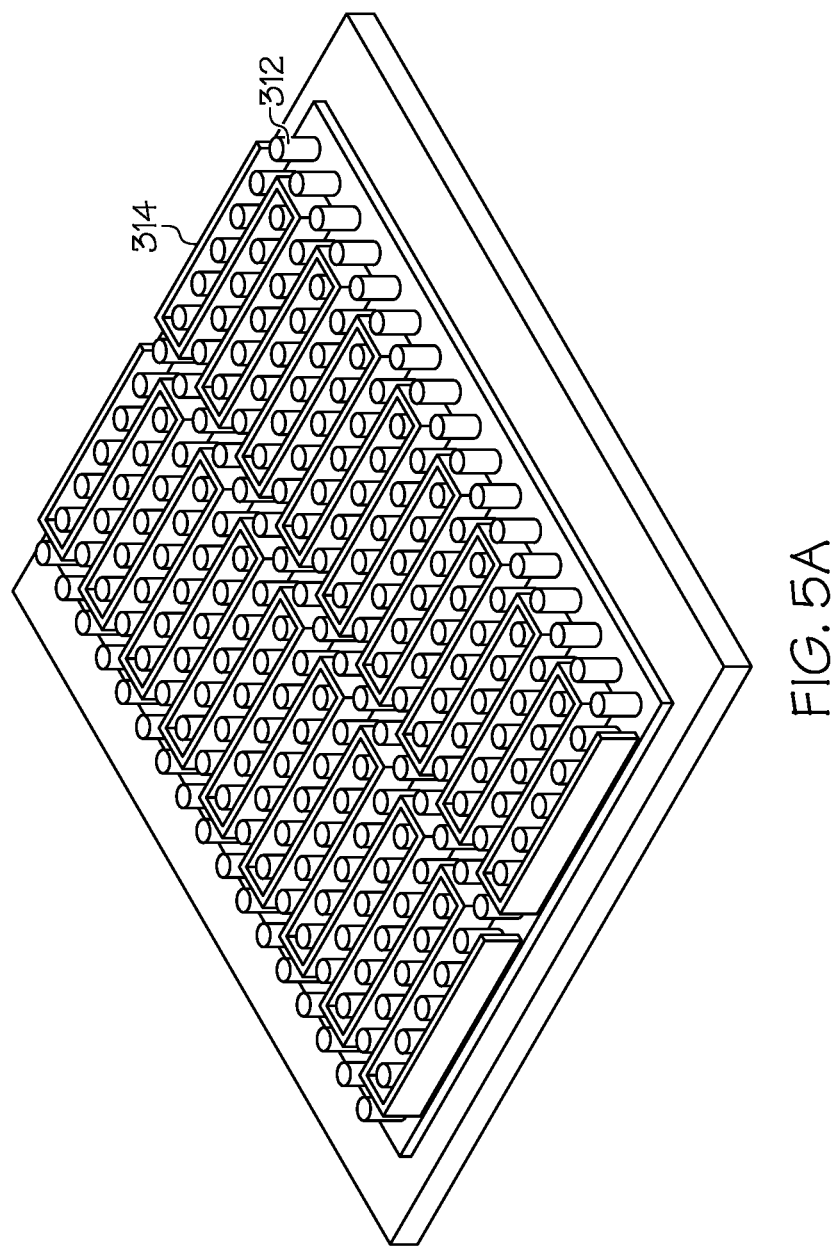
FIG. 5A depicts an illustrative 3D printed cold plate having a serpentine porous wall, according to one or more embodiments shown and described herein.
Figure 5B:
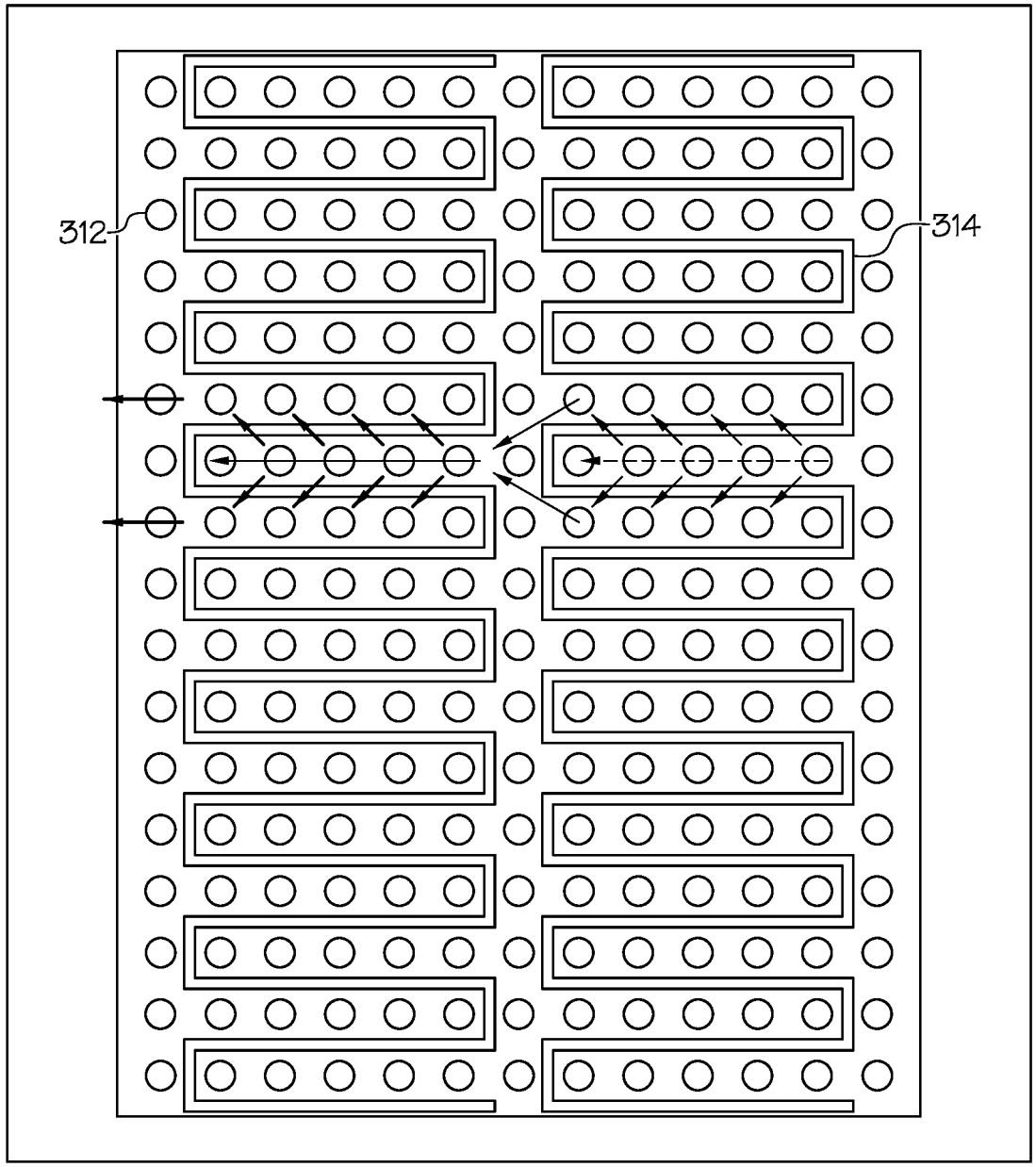
FIG. 5B depicts an illustrative fluid flow through the serpentine porous wall of the 3D printed cold plate of FIG. 5A, according to one or more embodiments shown and described herein.

Turning now to FIGS. 5A and 5B, the interior recess 310 of the cold plate 300 may further include a flow channel 314 in some embodiments. As illustrated in FIGS. 5A and 5B, the flow channel 314 may include a serpentine wall, such as a porous serpentine wall, which may be configured to form a fluid path around the plurality of fins 312. In some embodiments, the flow channel 314 may be 3D printed along with the fins 312 and cold plate 300, although embodiments in which the flow channel 314 is separately fabricated are also contemplated herein. In embodiments in which the flow channel 314 is 3D printed, the porosity and permeability in designated regions of the channel 314 may be controlled by the 3D-printing process in order to enhance heat transfer.

The flow channel 314 may be particularly beneficial for enhancing the cooling performance of single-phase cooling configurations. In these embodiments, the fluid that enters inlet port 160 is forced to flow through the s-shaped channel of created by the flow channel 314, as illustrated most clearly in FIG. 5B. As the fluid flow through the flow channel 314, the fluid may be simultaneously forced through and/or around the fins 312, which may increase the surface area of the fluid that comes into contact with the fins 312 and extract extra heat from the power devices 330. In these embodiments, the porosity of the flow channel 314 may be optimized and graded along the channel in order to balance the heat transfer and any potential pressure drop that may occur.

Referring now to block 220 of FIG. 2, the method may further involve fabricating power devices 330 using microelectromechanical systems (MEMS) technology, which involves creating miniaturized mechanical and/or electromechanical devices (e.g., sensors, actuators, electronics, etc.) and structures using microfabrication techniques. Once the power devices 330 are fabricated, the power devices 330 may be bonded to the 3D printed conductor substrate, as illustrated in block 230 of FIG. 2.

The method of bonding the power devices 330 to the conductor substrates 320 may be most clearly illustrated in FIG. 3. In this embodiment, the 3D printed conductor substrate 320 may include a plurality of cavities 322. Power devices 330 may be bonded into the cavities 322 of the 3D printed conductor substrate 320. In some embodiments, the power devices 330 may be bonded into the cavities 322 of the 3D printed conductor substrate 320 using silver sintering or other bonding techniques such as transient liquid phase (TLP) bonding or the like. The power devices 330 may include, for example, one or more semiconductor devices such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof.

Once the power devices 330 have been embedded in the cold plate 300, the method illustrated by FIG. 2 may further involve 3D-printing a PCB on and/or around the power devices 330 embedded into the cold plate 300, as shown at block 240. The PCB may include a plurality of conductive portions and insulation portions, which are 3D printed on and/or around the power devices 330. The conductive portions may include a plurality of conductive paths configured to interconnect the power devices 330 of the cold plate 300 together. Additionally, the conductive portions may further comprise a plurality of conductive pads, which, in combination with the conductive paths, enable electrical connection from components mounted on the cold plate 300 to the power devices 330 embedded within the cold plate 300.

It is understood that since the PCB is 3D printed, the conductive pads of the printed PCB do not include interceding insulation layers or the formation of vias formed using laser drilling or other machining and electroplating techniques. As such, the PCB may be formed directly on the cold plate 300 and on and/or around power devices 330 that are embedded therein without the added processing steps of machining cavities within a laminated PCB for receiving the power devices 330 and/or laser drilling and electroplating to form electric and/or thermal conductive vias.

In addition, by printing conductive portions with a 3D printer, the process of printing the conductive material may include directly printing on the electrical connections of the power devices 330, thereby forming seamless electrical connections from the power devices 330 to the conductive paths formed within the printed PCB. Conventional methods of forming a PCB are restricted to the layer-by-layer processes associated with lamination, which involves placing a plurality of relatively small vias between conductive layers within a PCB to provide electrical and/or thermal conductive paths. In contrast, a 3D printed PCB may be formed with a single large conductive portion, which reduces the electrical and thermal resistance paths within the PCB and enables the seamless electrical connections described herein.

Once the PCB has been 3D printed onto the cold plate, the method of FIG. 2 may further comprise mounting additional electronic components to the PCB, as shown at block 250. In some embodiments, one or more passive and/or active electrical components are mounted on the 3D printed PCB. The electrical components may be mounted on the PCB using a pick-and-place operation or manually soldered thereon. The electrical components may further provide logic control and/or switching functionality to and from the power devices 330 embedded within the cold plate 300.

Figure 6:
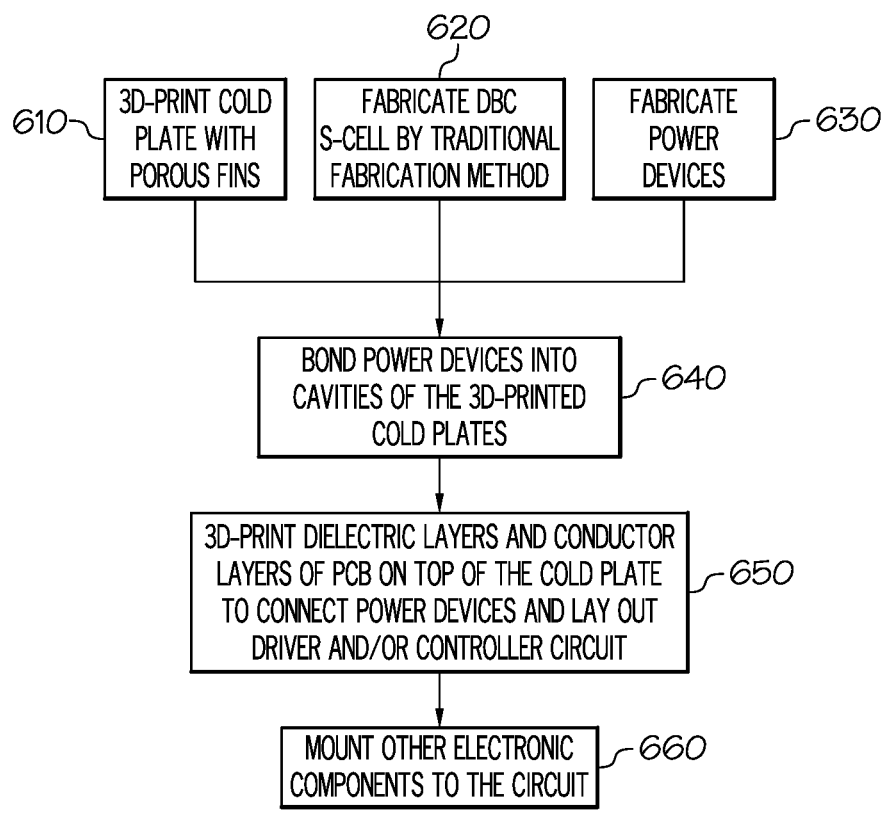
FIG. 6 depicts a flow diagram of an illustrative method for forming a 3D printed cold plate, according to one or more embodiments shown and described herein.

Referring now to FIG. 6, a flow diagram illustrating a method for forming an integrated power electronics package using a 3D printer to build the cold plate 300 is depicted. As illustrated at block 610, the method may first involve 3D-printing the cold plate 300 such that the cold plate 300 includes a hollow interior recess 310. In this embodiment, the 3D printer 105 may receive 3D-printing instructions 138*b* that instruct the 3D printer 105 to form the cold plate 300 with a hollow interior recess 310. As the 3D printer 105 prints the cold plate 300, the 3D printer may not deposit any material (e.g., plastic, metal, resin, etc.) within the interior portion of the cold plate, such that the hollow interior recess 310 is formed. Once the 3D printer 105 has carried out the instructions 138*b*, the cold plate 300 may be formed as a single, monolithic structure having the hollow interior recess 310. Furthermore, the cold plate 300 may be 3D printed such that the hollow interior recess 310 includes cooling components comprising a plurality of fins 312, such as porous fins, positioned within the hollow interior recess 310.

Moving on to block 630, the method may further involve fabricating the power devices 330 using micro-electromechanical systems (MEMS) technology. In the embodiment illustrated in FIG. 6, the method involves separately fabricating the conductor substrate 320, such as an S-cell substrate, and the insulation layer 340, such as a direct bonded copper (DBC) layer, using traditional fabrication methods, as shown at block 620. The conductor substrate 320 may be fabricated such that each substrate includes a cavity 322 for bonding with the power devices 330. Once the cold plate 300, conductor substrate 320, insulation layer 340, and power devices 330 have been separately fabricated, the various components may be bonded together, as shown at block 640.

It should be understood that, in embodiments in which the electrical insulation layer 340 is not 3D printed, such as the method shown in FIG. 6, DBC layers are implemented for their excellent electrical insulation and good heat spreading characteristics. As such, other devices having similar or better electrical insulation and heat spreading characteristics to those ofDBC layers may be implemented in place of the DBC layer contemplated herein.

In some embodiments, the conductor substrate 320 and insulation layer 340 are bonded together, after which the power device 330 is bonded into the cavity 322 of the conductor substrate 320. After the power device 330 is bonded to the conductor substrate 320, the power device 330, conductor substrate 320 and insulation layer 340 may be embedded in the cold plate 300. In other embodiments, the conductor substrate 320 and insulation layer 340 are bonded together and then bonded to the cold plate 300 prior to the power devices 330 being bonded to the cavities of 322 of the conductor substrate 320. In other embodiments still, the insulation layer 340 is first bonded to the cold plate 300, after which the conductor substrate 320 is bonded to the insulation layer 340 and the power devices 330 are bonded to the cavities 322 of the conductor substrate 320.

Once the cold plate 300, conductor substrate 320, electrical insulation layer 340 and power devices 330 are bonded, the method of FIG. 6 may further involve 3D-printing a PCB on and/or around the power devices 330 embedded into the cold plate 300, as shown at block 650. The PCB may include one or more conductive portions and insulation portions, which are 3D printed on and/or around the power devices 330. The conductive portions may comprise a plurality of conductive paths configured to interconnect the power devices 330 of the cold plate 300 together. Additionally, the conductive portions may further comprise a plurality of conductive pads, which, in combination with the conductive paths, enable electrical connection from components mounted on the cold plate 300 to the power devices 330 embedded within the cold plate 300.

Once the PCB has been 3D printed onto the cold plate, the method may further include mounting additional electronic components to the PCB, as shown at block 660. In some embodiments, one or more passive and/or active electrical components are mounted on the 3D printed PCB. The electrical components may be mounted on the PCB using a pick-and-place operation or manually soldered thereon. The electrical components may further provide logic control and/or switching functionality to and from the power devices 330 embedded within the cold plate 300.

Figure 7:
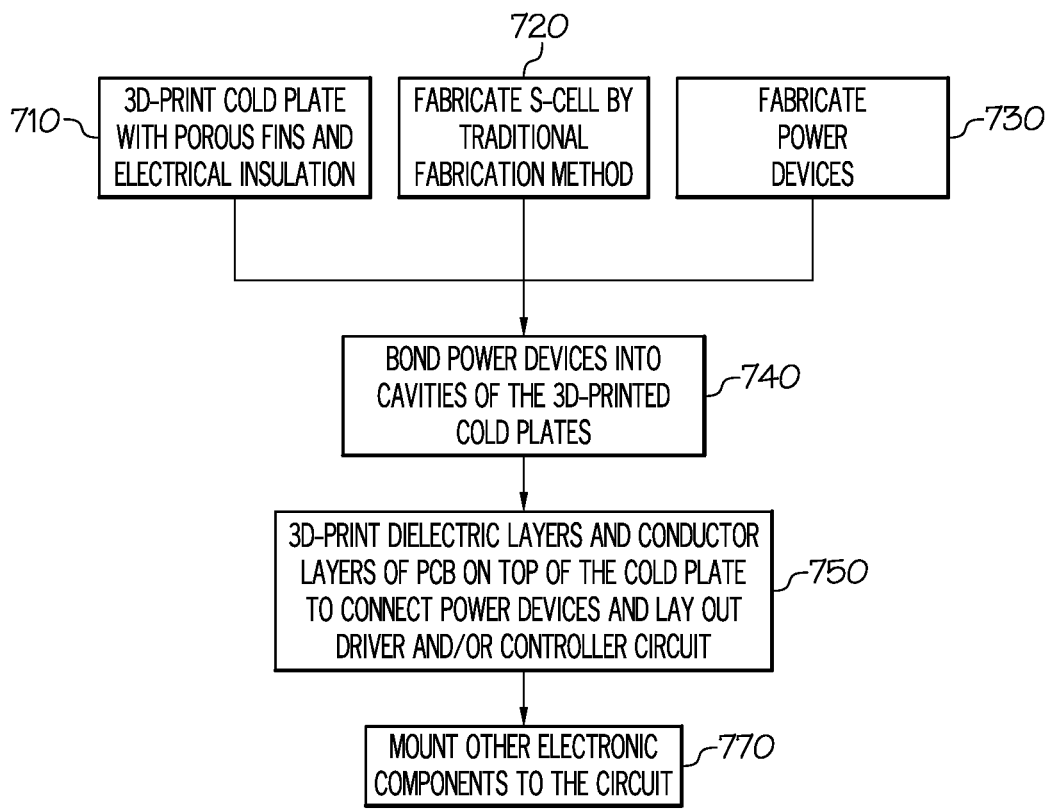
FIG. 7 depicts a flow diagram of an illustrative method for forming a 3D printed cold plate, according to one or more embodiments described herein.

Referring now to FIG. 7, a flow diagram of an illustrative method for forming an integrated power electronics package using a 3D printer to build the cold plate 300 is depicted. Initially, the method may involve 3D-printing the cold plate 300 such that the cold plate 300 comprises a hollow interior recess 310. Furthermore, the cold plate 300 may be 3D printed such that the hollow interior recess 310 includes cooling components including a plurality of fins 312, such as porous fins, positioned within the hollow interior recess 310.

Additionally, the electrical insulation layer 340 may be 3D printed along with the cold plate 300, such that the electrical insulation layer 340 is embedded in the cold plate 300, as described at block 710. Once the cold plate 300 and electrical insulation layer 340 are 3D printed, the method moves to block 720, in which the conductor substrate 320, such as an S-cell substrate, is separately fabricated using traditional fabrication methods. Moving to block 730, the power device 330 is also separately fabricated using microelectro-mechanical systems (MEMS) technology.

Referring still to FIG. 7, the 3D printed cold plate 300 and electrical insulation layer 340, conductor substrate 320, and power device 330 are bonded together at block 740. In some embodiments, the conductor substrate 320 and power device 330 may be sintered, soldered, transient liquid phase (TLP) bonded or similarly bonded to one another. The conductor substrate 320 and power device 330 may be further bonded to the electrical insulation layer 340 of the cold plate 300 using similar bonding means. Once the cold plate 300, conductor substrate 320, electrical insulation layer 340 and power devices 330 are bonded, the method of FIG. 7 may further involve 3D-printing a PCB on and/or around the power devices 330 embedded into the cold plate 300, as shown at block 750. The PCB may include one or more conductive portions and insulation portions, which are 3D printed on and/or around the power devices 330. The conductive portions may include a plurality of conductive paths configured to interconnect the power devices 330 of the cold plate 300 together. Additionally, the conductive portions may further include a plurality of conductive pads, which, in combination with the conductive paths, enable electrical connection from components mounted on the cold plate 300 to the power devices 330 embedded within the cold plate 300.

Once the PCB has been 3D printed onto the cold plate 300, the method may further include mounting additional electronic components to the PCB, as shown in block 770. In some embodiments, one or more passive and/or active electrical components are mounted on the 3D printed PCB. The electrical components may be mounted on the PCB using a pick-and-place operation or manually soldered thereon. The electrical components may further provide logic control and/or switching functionality to and from the power devices 330 embedded within the cold plate 300.

As should be appreciated in view of the foregoing, a 3D printed cold plate is disclosed herein. The cold plate may comprise an electrical insulation layer and a conductor substrate embedded within a top surface of the cold plate. The electrical insulation layer and conductor layer may be 3D printed such that the cold plate, conductor layer, and electrical insulation layer comprise a single structure, or the components may be separately formed and bonded together. The conductor substrates may comprise cavities which are configured to receive power devices, such that the when the power devices are bonded into the cavities, the power devices lie flush with the top surface of the cold plate. The cold plate may comprise a hollow interior recess and an inlet port and an outlet port which are both fluidly coupled to the interior recess, such that a coolant may flow into the hollow interior recess via the inlet port and out of the hollow interior recess via the outlet port. A plurality of fins may be positioned within the hollow interior recess to enhance the heat transfer of the cold plate, and may be porous and/or permeable fins in some embodiments. Furthermore, the cold plate may include a flow channel positioned within the interior chamber, which may comprise a serpentine porous wall. The flow channel and plurality of fins may be configured to provide either single-phase or two-phase cooling. Methods of forming integrated power electronics packages are also disclosed. The methods may involve 3D-printing a cold plate having a 3D printed electrical insulation layer and a 3D printed conductor substrate embedded within a top surface of the cold plate. Power devices may be bonded to the conductor substrates of the cold plate. Once the power devices have been bonded to the conductor substrates, a PCB may be 3D printed on and/or around the power devices. Additional electronic components may then be mounted to the 3D printed PCB to form the integrated power electronics package.

The terminology used herein is for the purpose of describing particular aspects only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "or a combination thereof" means a combination including at least one of the foregoing elements.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method, comprising:
   printing, using a 3D printer, as a single monolithic structure:
   a cold plate having a hollow interior recess and a plurality of fins within the hollow interior recess, and
   an electrical insulation layer embedded in a top surface of the cold plate;
   embedding a conductor substrate in the electrical insulation layer; and
   bonding a power device to the conductor substrate embedded in the electrical insulation layer via sintering, soldering, or utilizing a transient liquid phase (TLP) bonding process.

2. The method of claim 1, wherein the plurality of fins are porous fins and the 3D printer is configured to control a porosity of the plurality of fins during printing.

3. The method of claim 1, further comprising printing, using the 3D printer, a flow channel within the hollow interior recess of the cold plate.

4. The method of claim 3, wherein the flow channel is a porous serpentine wall.

5. The method of claim 1, wherein the cold plate is 3D printed to include an inlet port fluidly coupled to an outlet port such that cooling fluid is capable of flowing from the inlet port through the hollow interior recess of the cold plate and out the outlet port.

6. The method of claim 1, wherein the conductor substrate comprises a cavity for receiving the power device.

7. The method of claim 1, further comprising printing, using a 3D printer, a circuit board on top of or around the power device embedded in the cold plate.

8. The method of claim 7, wherein the circuit board comprises a conductive portion having a plurality of conductive paths electrically interconnecting the power device to a second power device.

9. The method of claim 7, further comprising mounting electronic components onto the circuit board.

10. The method of claim 9, wherein the circuit board comprises a conductive portion having a plurality of conductive pads and a plurality of conductive paths the electrically connect the power device to the electronic components mounted onto the circuit board.

11. The method of claim 9, wherein mounting the electronic components onto the circuit board comprises utilizing a pick-and-place operation.

12. The method of claim 9, wherein mounting the electronic components onto the circuit board comprises manually soldering the electronic components to the circuit board.

13. The method of claim 1, further comprising fabricating the conductor substrate prior to embedding in the electrical insulation layer.

14. The method of claim 13, wherein fabricating the conductor substrate comprises fabricating an S-cell substrate.

15. The method of claim 1, wherein embedding the conductor substrate comprises embedding an S-cell substrate in the electrical insulation layer.

16. The method of claim 1, further comprising fabricating the power device using micro-electro-mechanical systems (MEMS) technology prior to bonding the power device into the conductor substrate.

17. The method of claim 1, further comprising bonding the conductor substrate and the power device to the electrical insulation layer.

* * * * *